United States Patent [19]
Mori

[11] Patent Number: 5,808,365
[45] Date of Patent: Sep. 15, 1998

[54] SEMICONDUCTOR DEVICE AND METHOD OF MANUFACTURING THE SAME

[75] Inventor: Hidemitsu Mori, Tokyo, Japan

[73] Assignee: NEC Corporation, Tokyo, Japan

[21] Appl. No.: 781,815

[22] Filed: Jan. 9, 1997

[30] Foreign Application Priority Data

Jan. 10, 1996 [JP] Japan .................................. 8-002108

[51] Int. Cl.[6] .......................... H01L 23/48; H01L 23/52; H01L 29/40
[52] U.S. Cl. .......................... 257/775; 257/750; 257/773; 257/774; 257/313
[58] Field of Search .................................. 257/775, 750, 257/757, 773, 774, 776; 438/618, 621, 622, 624, 626, 631, 634

[56] References Cited

U.S. PATENT DOCUMENTS

| | | | |
|---|---|---|---|
| 5,144,579 | 9/1992 | Okabe et al. | 365/149 |
| 5,204,286 | 4/1993 | Doan | 438/624 |
| 5,243,220 | 9/1993 | Shibata et al. | 257/748 |
| 5,248,628 | 9/1993 | Okabe et al. | 437/47 |
| 5,279,989 | 1/1994 | Kim | 438/624 |
| 5,291,058 | 3/1994 | Samata et al. | 257/774 |
| 5,330,934 | 7/1994 | Shibata et al. | 437/195 |
| 5,591,673 | 1/1997 | Chao et al. | 438/631 |

FOREIGN PATENT DOCUMENTS 3-174766  7/1991  Japan .
4-5823    1/1992  Japan .

*Primary Examiner*—Mahshid D. Saadat
*Assistant Examiner*—Jhihan B. Clark
*Attorney, Agent, or Firm*—Foley & Lardner

[57] ABSTRACT

The invention relates to a semiconductor device and a method of manufacturing the same. The semiconductor device includes a semiconductor substrate, a first etching stopper insulating film, a first insulating interlayer, a pair of first contact holes, first buried conductive layers, a first interconnection formed on one of the first buried conductive layers, a second insulating interlayer, a second contact hole, a second buried conductive layer, and a second interconnection. The first contact holes are formed at a predetermined interval in a direction parallel to the surface of the semiconductor substrate so as to reach a semiconductor element formed on the semiconductor substrate through the first insulating interlayer and the etching stopper insulating film. The second contact hole is formed to reach the other first buried conductive layer through the second insulating interlayer corresponding to a portion above the first buried conductive layer. Each of the first contact holes is constituted by a small-diameter lower contact hole formed in the first etching stopper insulating film and a large-diameter upper cyontact hole formed in the first insulating interlayer, and the first buried conductive layers do not project from the surface of the first insulating interlayer.

16 Claims, 12 Drawing Sheets

5,808,365

SEMICONDUCTOR DEVICE AND METHOD OF MANUFACTURING THE SAME

BACKGROUND OF THE INVENTION

1. Field of the Invention

The present invention relates to a semiconductor device suitably applied to a semiconductor device including a DRAM (Dynamic Random Access Memory) with a COB (Capacitor Over Bit-line) structure in which a capacitor is arranged on a layer above a bit line, and a method of manufacturing the same.

2. Description of the Prior Art

With the advance of micropatterning of DRAM memory cells, it is becoming increasingly difficult to obtain sufficient storage capacitance. Accordingly, a COB structure in which a capacitor is formed above a bit line is widely used because the entire surface area of the capacitor can be made large. In the DRAM of the COB structure, a contact hole for connecting a node electrode as one electrode of the capacitor and an element active region is formed from a layer above a contact hole for connecting the bit line and the element active region. For this reason, with the advance of micropatterning of DRAM memory cells, the aspect ratio of the contact hole for connecting the node electrode and the element active region greatly increases, and a conductive material is difficult to bury in the contact hole. As a result, an error easily occurs at the contact hole.

As a method for solving this problem, the following technique is proposed. According to this technique, when a contact hole for connecting a bit line and an element active region is formed in a lower insulating interlayer, a contact hole for connecting a node electrode and the element active region is simultaneously formed. A pad is formed in the contact hole using a conductive layer connected to the element active region. A contact hole is again formed in an upper insulating interlayer. The node electrode is connected to the pad via this contact hole. Such technique will be described below.

FIGS. 1A to 1G are sectional views respectively showing the steps in a method of manufacturing a semiconductor device as the first prior art. First, as shown in FIG. 1A, a field oxide film 2 is formed on a p⁻-type semiconductor substrate 1 by a normal LOCOS process. A gate oxide film 3 is formed on an element active region partitioned by the field oxide film 2. A conductive film such as a polysilicon film or a tungsten silicide film is grown to a film thickness of about 200 nm on the entire surface and patterned into a predetermined shape to form word lines 5. An impurity is doped in the semiconductor substrate 1 to form source/drain regions 4, thereby forming a MOS transistor using the word line 5 as a gate electrode. Thereafter, a first insulating interlayer 7 such as a silicon oxide film doped with an impurity, e.g., phosphorus or boron is grown to a film thickness of about 300 nm on the entire surface.

As shown in FIG. 1B, the resist pattern of a contact hole 9a for connecting a bit line (not shown) and the element active region and that of a contact hole 9b for connecting a storage node electrode (not shown) and the element active region are simultaneously formed by normal lithography. After isotropic etching is slightly performed using the resist patterns as a mask, anisotropic etching is performed to form contact holes each tapered wider in the upward direction. As shown in FIG. 1C, e.g., a polysilicon film doped with an impurity such as phosphorus is grown to a film thickness of about 600 nm on the entire surface, and is etched back to form a first buried conductive layer 11 as a pad in each contact hole.

As shown in FIG. 1D, for example, a conductive layer such as a tungsten silicide film is grown to a film thickness of about 150 nm on the entire surface and patterned into a predetermined shape to form a bit line 12. As shown in FIG. 1E, for example, a second insulating interlayer 14, such as a silicon oxide film doped with an impurity, e.g., phosphorus or boron, having a film thickness of about 300 nm is formed on the entire surface.

Subsequently, as shown in FIG. 1F, a contact hole 18 is formed in a layer above the first buried conductive layer 11 which is formed in FIG. 1C and buried in the contact hole 9b for connecting the node electrode and the element active region. As shown in FIG. 1G, a polysilicon film doped with an impurity such as phosphorus is grown to a film thickness of about 600 nm on the entire surface and then patterned into a predetermined shape to form a storage node electrode 17. If the storage node electrode 17 is formed to have a three-dimensional structure such as a fin shape or a cylinder shape, the storage capacitance can be further increased.

In the first prior art, even when a contact hole having a larger aspect ratio is to be formed, a plurality of contact holes can be stacked. For this reason, the depth of the contact hole on each stage can be made small. Compared to a case wherein a contact hole is formed from an upper layer in only one stage, it becomes possible to prevent the formation of an incomplete conact hole.

In the first prior art, however, a sufficient margin cannot be assured in forming the contact hole 18 on the second stage above the contact hole 9b on the first stage. That is, in this technique, since the upper portion of the contact hole 9b is tapered wider by isotropic etching, the pad 11 having a diameter larger than that of the contact hole formed in advance is formed at this upper portion. The tapering size to which the upper portion can be widened depends on the film thickness of the contact hole 9b on the first stage. For this reason, to prevent a short circuit between adjacent pads, a thick pad cannot be formed. For example, if the diameter of the contact hole/interval=150 nm/300 nm, the pad film thickness is about 100 nm at most; and if the diameter of the contact hole/interval=200 nm/200 nm, the pad film thickness decreases to about 50 nm. In forming a contact hole on the second stage, if the opening is formed at the end of the pad due to misalignment, the pad does not sufficiently serve as a stopper in forming the opening. Consequently, the contact hole on the second stage surface extends through the pad to easily cause errors such as a short circuit between adjacent word lines or reaches the element active region to damage this region.

To solve the problem of misalignment in the first prior art, for example, as shown in FIG. 2, it is only necessary to form a large pad 11A of a conductive layer widened in a mushroom-cap shape above the first insulating interlayer 7 having the pad 11 in the contact hole formed in advance, and to form a contact hole 18 on the second stage so as to contact the upper portion of the large pad 11A. Such technique is disclosed in, e.g., Japanese Unexamined Patent Publication No. 4-5823. According to the second prior art, as shown in FIG. 3A, after a MOS transistor is formed, a first etching stopper insulating film 6, a first insulating interlayer 7, a first buffer layer 21, and a silicon oxide film 22 are sequentially deposited.

Next, as shown in FIG. 3B, normal lithography and etching are performed up to the upper portions of the first etching stopper insulating film 6, thereby forming contact holes 9a and 9b. As shown in FIG. 3C, side walls 23 consisting of second buffer layers 23 are formed inside the formed contact holes, and openings are formed in the first etching stopper insulating film 6 using the first buffer layer 21 and the second buffer layers 23 as a mask.

As shown in FIG. 3D, conductive layers are buried in the contact holes and etched back to form pads 11. After a conductive layer is further deposited on the uppermost layer, a bit line 24a and a contact electrode 24b as a storage node electrode are formed by normal lithography and etching. Finally, as shown in FIG. 3E, side walls consisting of third buffer layers 25 are formed on the side walls of the bit line 24a and the contact electrode 24b, and the first buffer layer 21 is etched using the bit line 24a, the contact electrode 24b, and the third buffer layers 25 as a mask to simultaneously form a bit line 12 and a large pad 11A.

In the second prior art, short circuits easily occur between adjacent pads and between the pad and the bit line. This problem is becoming more serious as memory cells continue to shrink. FIG. 8 is a plan view showing an example of the configuration of memory cells in an open bit line system. In this example, when contact holes 9a each for connecting a bit line 12 and an element active region 4 and contact holes 9b each for connecting a node electrode 17 and the element active region 4 are simultaneously formed, the contact holes 9a, 9b are aligned at equal intervals in such a manner that the diameter of each contact hole and the interval between adjacent pads are at about 1:1. Therefore, in the method of forming a pad formed on the contact hole and having a diameter larger than that of the contact hole, the interval between adjacent pads is very narrow.

As shown in FIG. 2, the bit line 12 and the large pad 11A adjacent thereto are formed at the same level on the first insulating interlayer 7, and the large pad 11A is formed to have a diameter larger than that of the contact hole 9b. Therefore, as shown in the lower right corner of FIG. 8, a portion X susceptible to a short circuit between the pad and the bit line is undesirably formed. Further, since the interconnection and the pad portion are simultaneously formed, lithography is difficult to perform at a portion where the pad is close to the bit line. This method is not suitable for application to micropatterned memory cells.

To suppress the short circuit, Japanese Unexamined Patent Publication No. 3-174766 proposes a modification as shown in FIG. 4. According to this technique, after a large pad 11A is formed on a pad 11, an insulating interlayer 26 between the pad portion and the bit line is formed thereon to have a film thickness of about 100 nm. A bit line 12 is formed after a contact hole 27 for connecting the bit line 12 and the large pad 11A is formed in the insulating interlayer 26. A second insulating interlayer 14 is formed, and a contact hole 18 is formed to form a node electrode 17.

The improved technique described in this publication however, requires a larger number of steps from the step of depositing the insulating interlayer 26 between the pad portion and the bit line to the step of forming the contact hole 27 for connecting the bit line and the pad portion. As a result, the labor and cost required increase.

In addition, steps in a peripheral circuit portion and a memory cell also increase.

SUMMARY OF THE INVENTION

The present invention has been made to solve the above problems in the prior arts and has as its object to provide an improved contact hole structure in a semiconductor device in which a sufficient margin can be assured between a contact hole and an adjacent line even if a cell is micropatterned and the number of steps can be decreased, and a method of manufacturing the same.

To achieve the above object, according to the first basic aspect of the present invention, there is provided a semiconductor device comprising a semiconductor substrate having a semiconductor element formed thereon, a first etching stopper insulating film formed on the semiconductor substrate, a first insulating interlayer formed on the etching stopper insulating film and having etching selectivity with respect to the etching stopper insulating film, at least a pair of first contact holes formed at a predetermined interval in a direction parallel to a surface of the semiconductor substrate so as to reach the semiconductor element via the first insulating interlayer and the etching stopper insulating film, first buried conductive layers formed inside the first contact holes, respectively, a first interconnection integrally formed on one of the first buried conductive layers, a second insulating interlayer formed on the first interconnection and the first insulating interlayer, a second contact hole formed to reach the other one of the first buried conductive layers via the second insulating interlayer corresponding to a portion above the first buried conductive layer, and a second buried conductive layer formed in the second contact hole and a second interconnection integrally connected to the second buried conductive layer, wherein each of the first contact holes is constituted by a small-diameter lower contact hole formed in the first etching stopper insulating film and a large-diameter upper contact hole formed in the first insulating interlayer, and the first buried conductive layers do not project from a surface of the first insulating interlayer.

In the first basic aspect, the first insulating interlayer and the second insulating interlayer may have a second etching stopper insulating film formed therebetween, and the second contact hole may be constituted by a large-diameter upper contact hole formed in the second insulating interlayer and a small-diameter lower contact hole formed in the second etching stopper insulating film.

The upper contact hole preferably has a side wall conductive layer formed on an inner surface and having an inner diameter equal to an inner diameter of the lower contact hole.

More specifically, the semiconductor element is a DRAM memory cell, the first interconnection is a bit line, and the second interconnection is a storage node electrode.

To achieve the above object, according to the second basic aspect of the present invention, there is provided a method of manufacturing a semiconductor device, comprising the steps of sequentially forming an etching stopper insulating film and a first insulating interlayer on a semiconductor substrate having a semiconductor element formed thereon, forming at least a pair of first upper contact holes in the first insulating interlayer, forming first side wall conductive layers on inner surfaces of the respective upper contact holes, forming lower contact holes in the etching stopper insulating film in the pair of first upper contact holes by using the first side wall conductive layers as a mask so as to reach the semiconductor element, forming first buried conductive layers by burying conductive layers in the pair of contact holes each constituted by the upper and lower contact holes, forming a first interconnection above one of the pair of buried conductive layers, forming a second insulating interlayer on an entire surface, forming a second contact hole in the second insulating interlayer corresponding to a portion above the other one of the first buried conductive layers, and forming a second buried conductive layer in the second contact hole and a second interconnection integrally connected to the second buried conductive layer.

In forming the second contact hole in the first basic aspect, the manufacturing method more preferably comprises the steps of sequentially forming a second etching stopper insulating film and a second insulating interlayer on the first insulating interlayer, forming a second upper contact hole in the second insulating interlayer corresponding to a portion above the other one of the first buried conductive layers, forming a second side wall conductive layer on an inner surface of the second upper contact hole, and forming a second lower contact hole in the second etching stopper insulating film in the second upper contact hole by using the second side wall conductive layer as a mask so as to reach the first buried conductive layer, the second lower contact hole and the second upper contact hole forming a second contact hole.

The manufacturing method may further comprise the step of forming an etching stopper buffer film on the first insulating interlayer, and removing the etching stopper buffer film by etching in forming the first buried conductive layer.

According to the present invention, each first-stage contact hole formed on the semiconductor substrate is constituted by a large-diameter upper contact hole and a small-diameter lower contact hole, and the surface of the first buried conductive layer buried in the contact hole on the first stage does not project from the surface of the first insulating interlayer. Therefore, a vertical margin between the pad portion and the bit line to be formed thereabove is easily assured. In forming the contact hole on the second stage, a sufficient margin can be assured. In the case of a 1-Gbit DRAM, according to the present invention, a pad is formed which has a film thickness of about 200 nm obtained by subtracting the thickness of the film buried in the insulating interlayer from the film thickness of the insulating interlayer. To the contrary, in the first prior art described above, the film thickness of the pad is about 100 nm at most in order to prevent a short circuit between pads.

In the present invention, since the contact holes on the first stage are formed in the insulating interlayer, a short circuit between the conductive layers respectively buried in the adjacent contact holes can be prevented, and at the same time a short circuit between the pad and the first interconnection can be prevented. In addition, since the diameter of the lower contact hole is small, a short circuit between the conductive layers formed on the semiconductor substrate can be prevented, and a larger margin can be assured between the respective pads. If the surface of the contact hole on the first stage is recessed from the level of the surface of the insulating interlayer, a desired vertical margin of the pad with respect to the first interconnection can be assured.

Furthermore, according to the present invention, since the respective contact holes on the first and second stages are directly connected to each other, a total of four steps, i.e., the step of forming an insulating interlayer on a pad on the first stage, which is required to prevent a short circuit between the pad on the first stage and the interconnection, and the three steps of lithography, etching, and resist peeling, which are required to form contact holes in the insulating interlayer, can be eliminated, and the number of steps can be greatly decreased.

The above and many other advantages, features and additional objects of the present invention will become manifest to those versed in the art upon making reference to the following detailed description and accompanying drawings in which preferred embodiments incorporating the principles of the present invention are shown by way of illustrative example.

DETAILED DESCRIPTION OF THE PREFERRED EMBODIMENTS

Preferred embodiments of the present invention will be described below with reference to the accompanying drawings.

Figure 5:
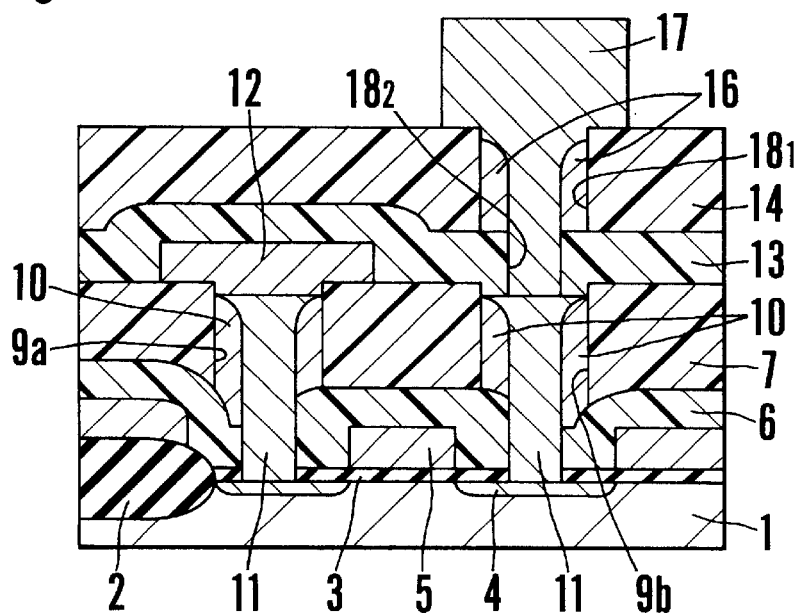
FIG. 5 is a sectional view of the main part of a semiconductor device according to the present invention taken along the line V—V in the plan layout view of FIG. 8.
Figure 8:
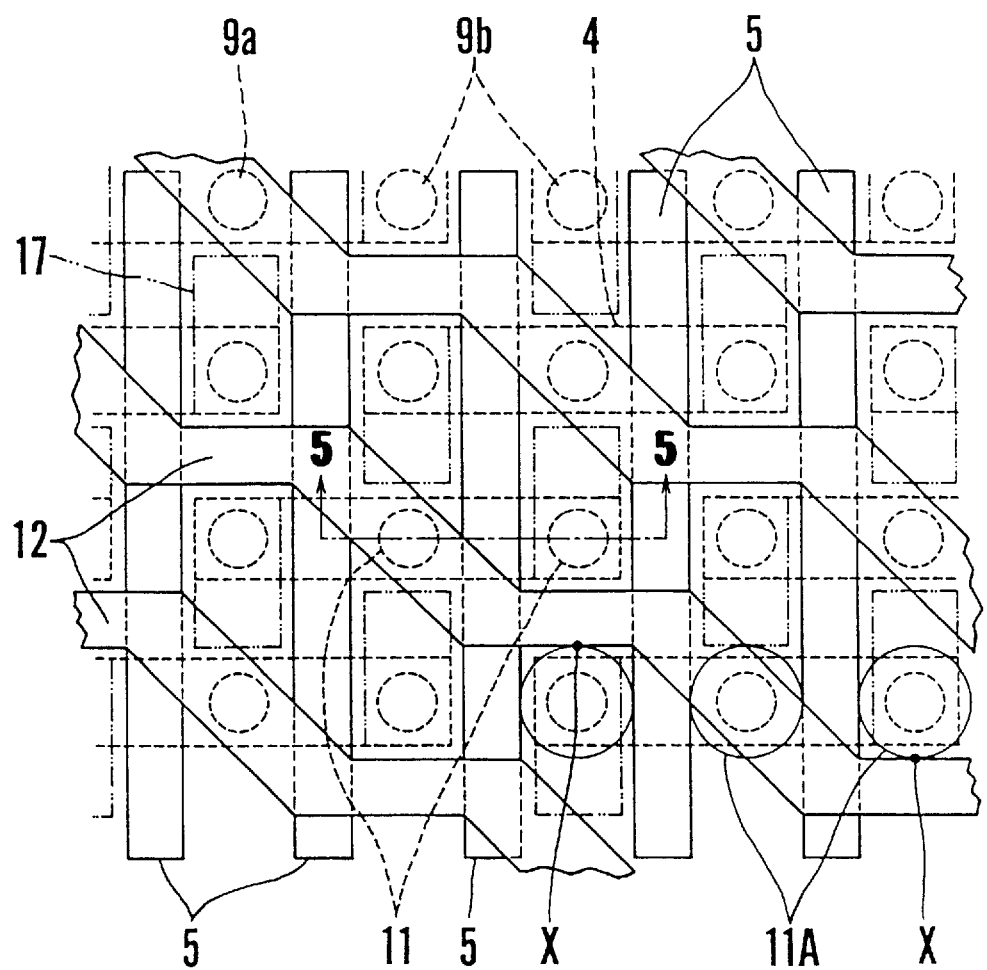
FIG. 8 is a plan layout view of DRAMs to which the present invention is applied.

FIG. 5 is a sectional view of a semiconductor device according to the present invention taken along the line V—V in the plan layout view of FIG. 8

Figure 6A:
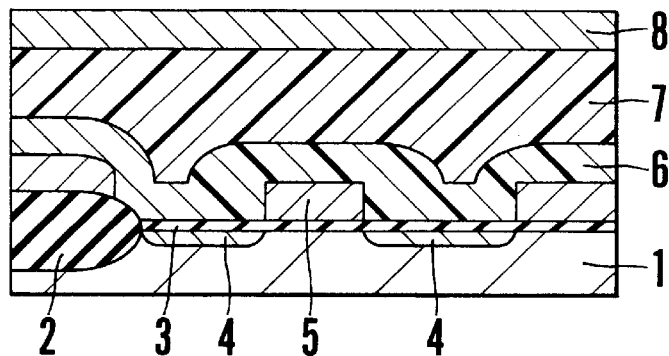
FIGS. 6A to 6H are sectional views respectively showing the steps in the first manufacturing method of the semiconductor device shown in FIG. 5.

FIGS. 6A to 6H are sectional views respectively showing the steps in a method of manufacturing the semiconductor device shown in FIG. 5 according to the first embodiment. First, as shown in FIG. 6A, a field oxide film 2 is formed on a p$^-$-type semiconductor substrate 1 by LOCOS, and a gate oxide film 3 is formed over element active regions 4 by oxidation of the substrate. A conductive film, such as a polysilicon film or a tungsten silicide film, having a film thickness of about 200 nm is formed on the entire surface and then patterned into a predetermined shape to form word lines 5. An impurity is doped in the semiconductor substrate 1 to form source/drain regions (element active regions) 4, thereby forming a MOS transistor using the word line 5 as a gate electrode. A first etching stopper insulating film 6, such as a silicon nitride film or an undoped silicon oxide film, having a film thickness of about 100 nm is formed on the resultant structure. A first insulating interlayer 7, such as a silicon oxide film doped with an impurity, e.g., phosphorus or boron, having a film thickness of about 300 nm is formed on the first etching stopper insulating film 6. A first etching stopper buffer film 8 consisting of, e.g., polysilicon and having a film thickness of about 300 nm is formed on the first insulating interlayer 7.

Figure 6B:
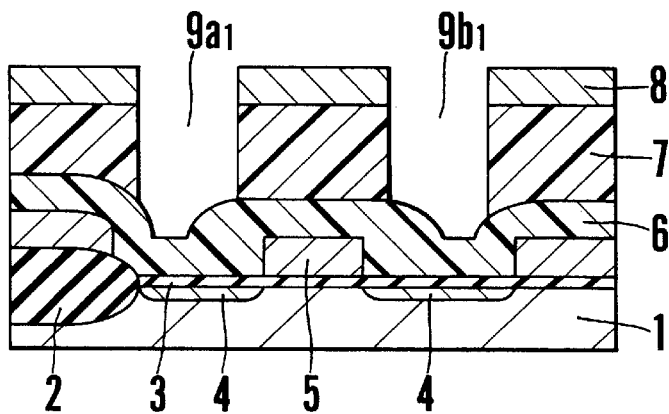
Figure 6C:
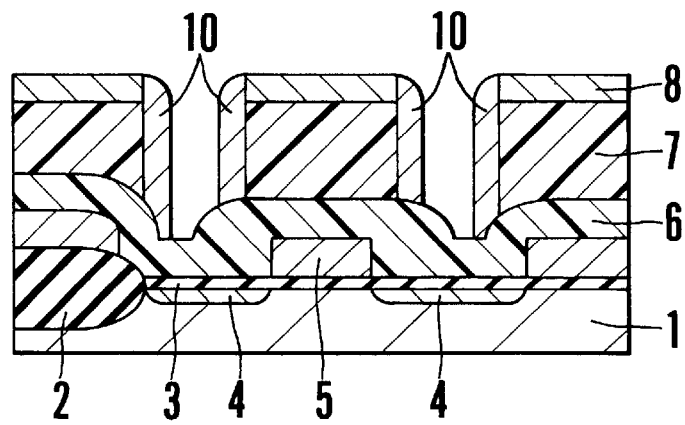
Figure 6D:
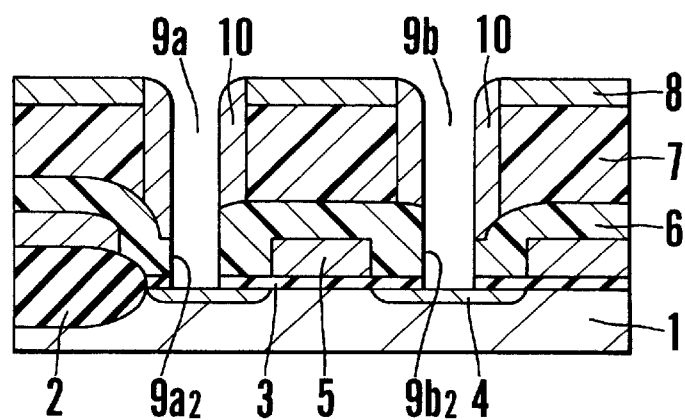

As shown in FIG. 6B, normal lithography and etching are performed to partially etch the first etching stopper buffer film 8 and the first insulating interlayer 7 up to the first etching stopper insulating film 6, thereby forming first upper contact holes $9a_1$ and $9b_1$ respectively at portions where a contact hole $9a$ for connecting a bit line (not shown) and the element active region 4 and a contact hole $9b$ for connecting a node electrode (not shown) and the element active region 4 are to be formed (see FIG. 6D). At this time, for example, in the case of a 1-Gbit DRAM, the diameter of the contact hole at the upper portion thereof is about 200 nm. Next, as shown in FIG. 6C, a conductive layer such as a polysilicon layer doped with an impurity, e.g., phosphorus or a tungsten film is grown to have a film thickness of about 50 nm on the entire surface including the first upper contact holes $9a_1$ and $9b_1$. The conductive layer is anisotropically etched back to form first side wall conductive layers 10 on the inner surfaces of the first upper contact holes $9a_1$ and $9b_1$.

As shown in FIG. 6D, the first etching stopper insulating film 6 and the gate oxide film 3 which are positioned below each of the first upper contact holes $9a_1$ and $9b_1$ are etched using the first etching stopper buffer film 8 and the first side wall conductive layers 10 as a mask, thereby forming first lower contact holes $9a_2$ and $9b_2$ for connecting the bit line and the node electrode to the element active regions 4. With this process, the contact holes $9a$ and $9b$ on the first stage are completely formed. At this time, the diameters of the contact holes $9a$ and $9b$ at their lower portions are made relatively small due to the presence of the first side wall conductive layers 10. In the above-mentioned example, the diameter of the contact hole at the lower portion thereof is about 100 nm.

Figure 6E:
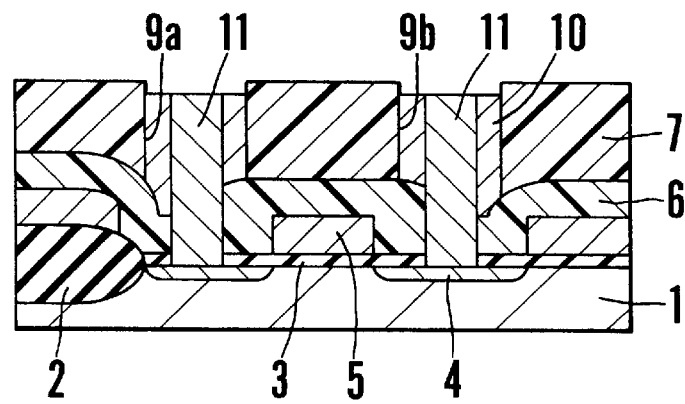

As shown in FIG. 6E, a conductive film such as a polysilicon film doped with an impurity, e.g., phosphorus or a tungsten film is grown to have a film thickness of about 600 nm on the entire surface so as to completely bury the contact holes $9a$ and $9b$. The conductive film is etched back to form first buried conductive layers 11 connected to the element active regions 4 inside the contact holes. Each first buried conductive layer 11 is formed into an almost T shape which is 200 nm in diameter from the upper portion of the contact hole to the first etching stopper insulating film 6 and 100 nm in diameter from the first etching stopper insulating film 6 to the bottom surface of the contact hole. If the buried portion having a diameter of 200 nm is so etched as to be recessed by about 100 nm from the level of the surface of the first insulating interlayer 7, a vertical margin can be easily assured between the pad portion and the bit line (not shown) to be formed thereabove.

Figure 6F:
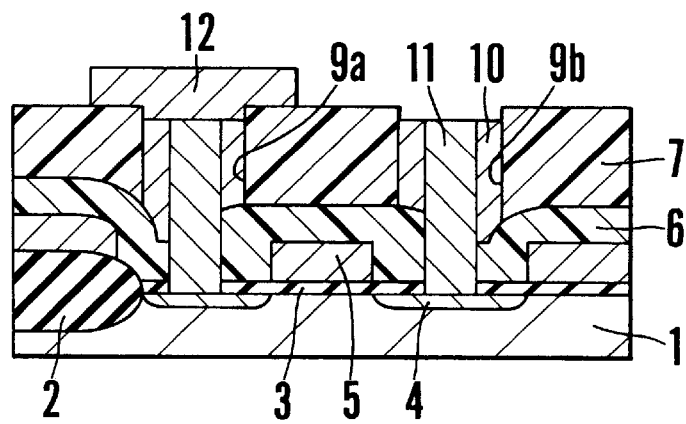
Figure 6G:
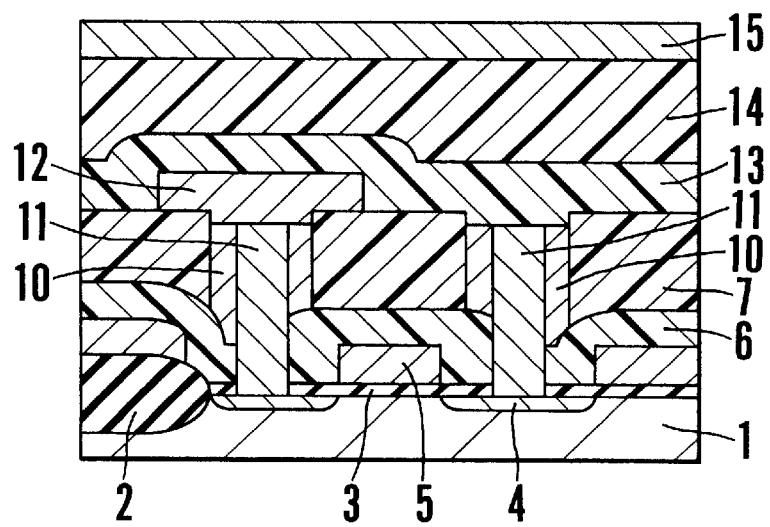

As shown in FIG. 6F, a conductive layer such as a tungsten silicide film is grown to a film thickness of about 150 nm on the entire surface, and patterned into a predetermined shape to form a bit line 12. As shown in FIG. 6G, a second etching stopper insulating film 13 such as a silicon nitride film or an undoped silicon oxide film, a second insulating interlayer 14 such as a silicon oxide film doped with an impurity, e.g, boron, and a second etching stopper buffer film 15 are continuously grown on the entire surface to film thicknesses of about 100 nm, about 300 nm, and about 300 nm, respectively.

Figure 6H:
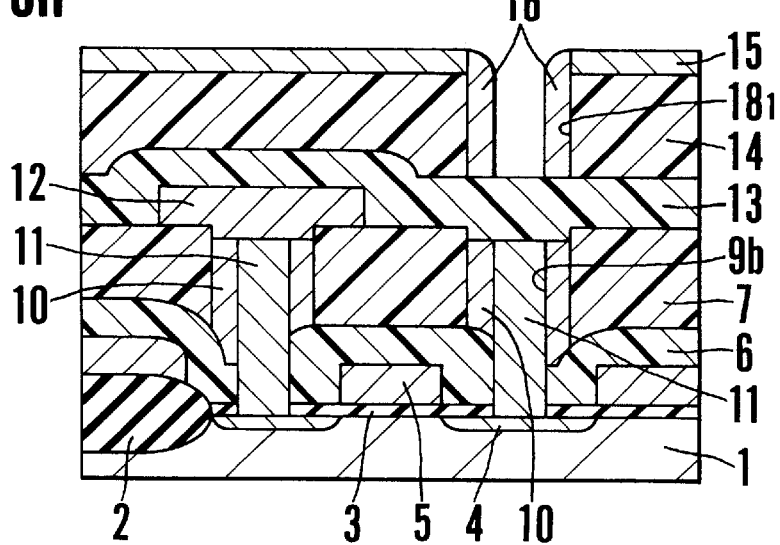

Subsequently, as shown in FIG. 6H, normal lithography and etching are performed to partially etch the second etching stopper buffer film 15 and the second insulating interlayer 14 up to the upper surface of the second etching stopper insulating film 13, thereby forming a second upper contact hole $18_1$ at only a portion corresponding to the contact hole 9b for connecting the node electrode (not shown) and the element active region 4. A conductive layer such as a polysilicon layer doped with an impurity, e.g., phosphorus or a tungsten film is grown to a film thickness of about 50 nm on the entire surface including the second upper contact hole $18_1$. The conductive layer is etched back to form a second side wall conductive layer 16 inside the second upper contact hole $18_1$.

Finally, as shown in FIG. 5, a second lower contact hole $18_2$ is formed above the first buried conductive layer 11 and the first side wall conductive layers 10 by using the second etching stopper buffer film 15 and the second side wall conductive layer 16 as a mask. The upper and lower contact holes $18_1$ and $18_2$ completely form a contact hole 18 on the second stage. Further, a conductive layer such as a polysilicon film doped with an impurity, e.g., phosphorus or a tungsten film is grown to have a film thickness of about 600 nm on the entire surface, and patterned into a predetermined shape to form a storage node electrode 17.

Figure 1A:
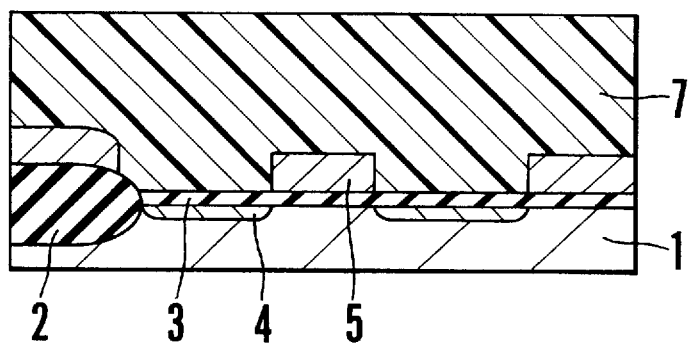
FIGS. 1A to 1G are sectional views respectively showing the steps in a method of manufacturing a semiconductor device as the first prior art.
Figure 1B:
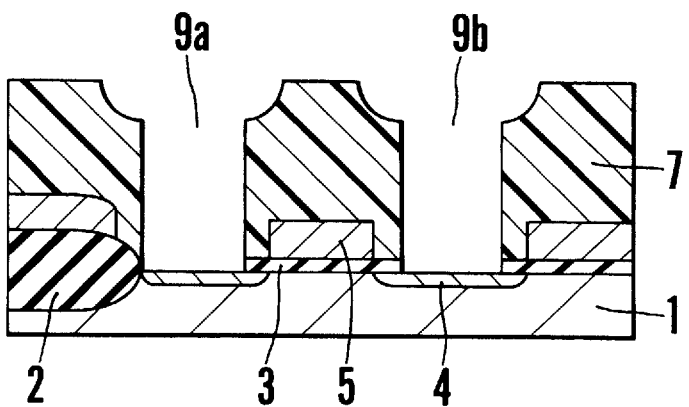
Figure 1C:
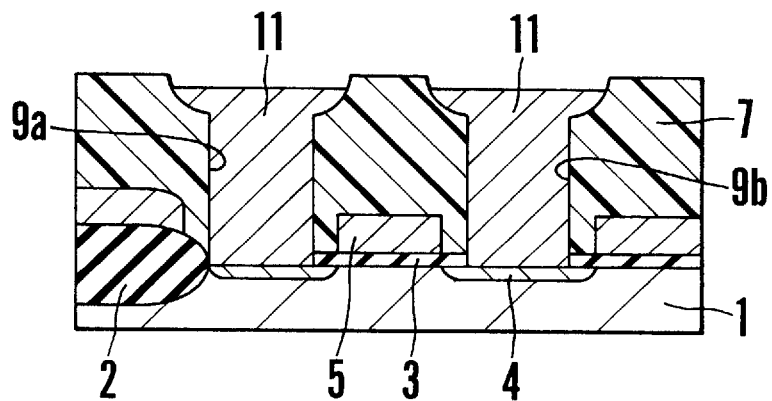
Figure 1D:
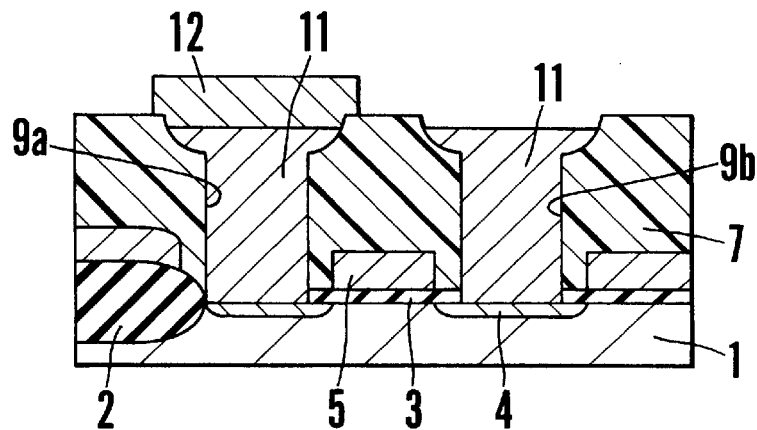
Figure 1E:
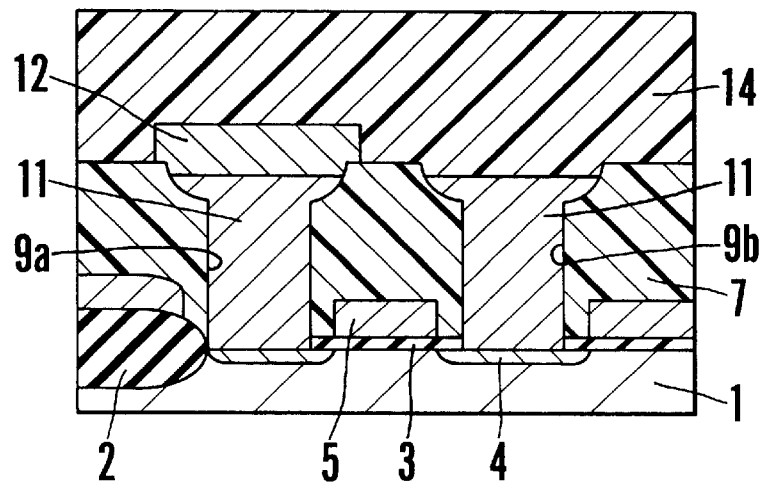
Figure 1F:
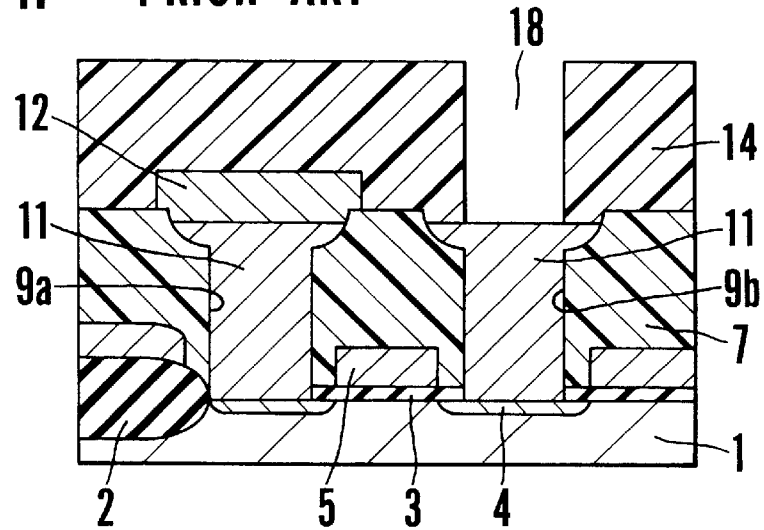
Figure 1G:
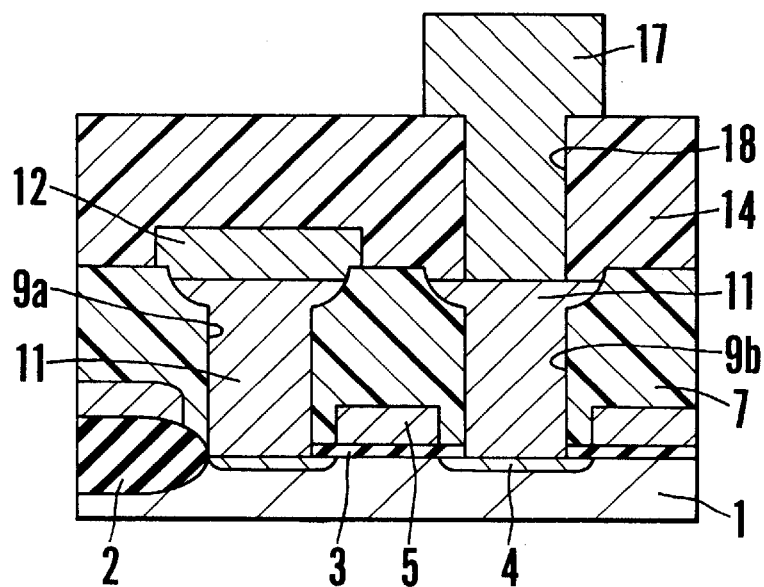
Figure 2:
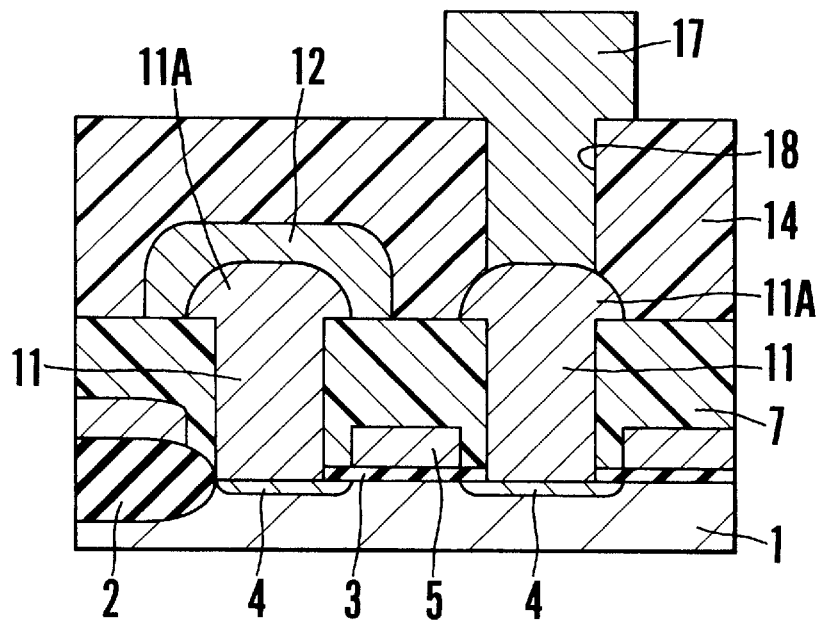
FIG. 2 is a sectional view of a semiconductor device as the second prior art.
Figure 3A:
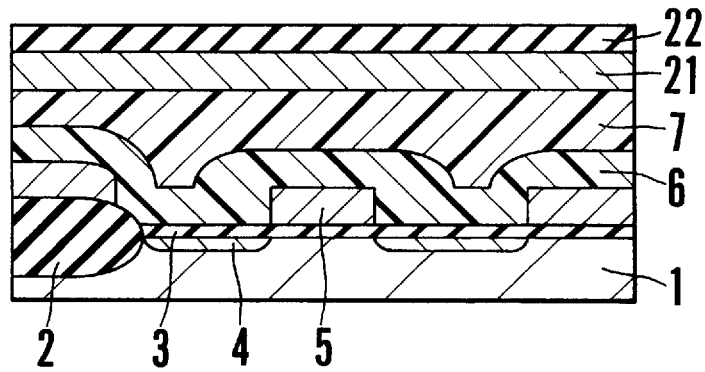
FIGS. 3A to 3E are sectional views respectively showing the steps in the manufacturing method of the second prior art shown in FIG. 2.
Figure 3B:
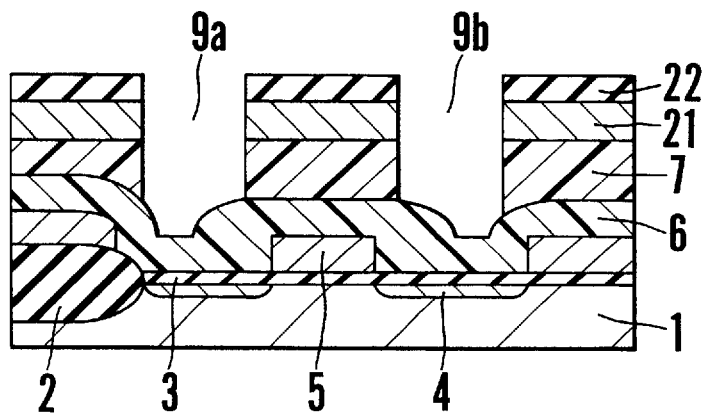
Figure 3C:
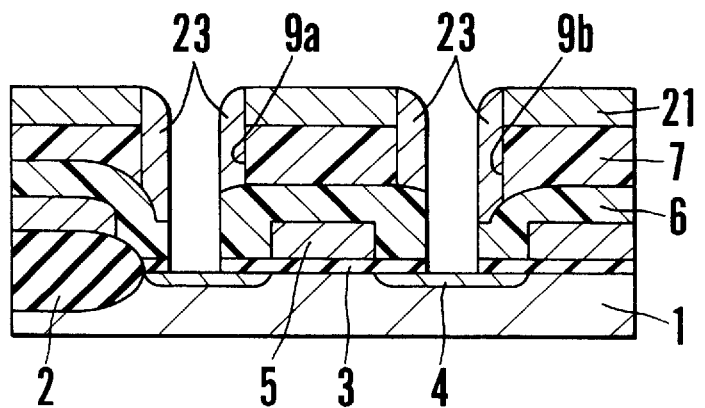
Figure 3D:
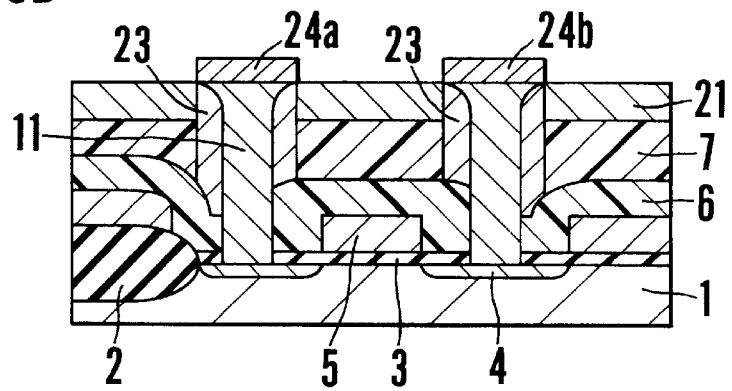
Figure 3E:
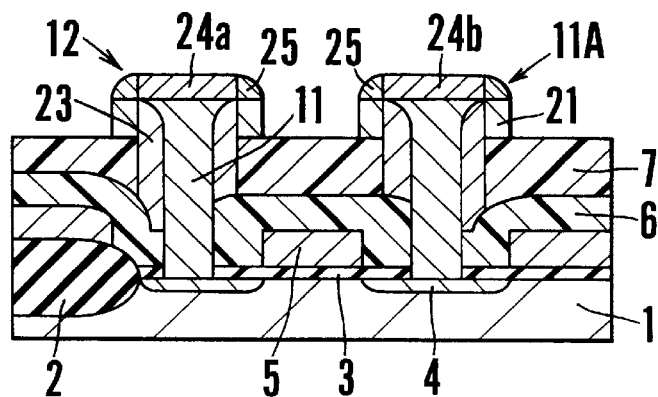
Figure 4:
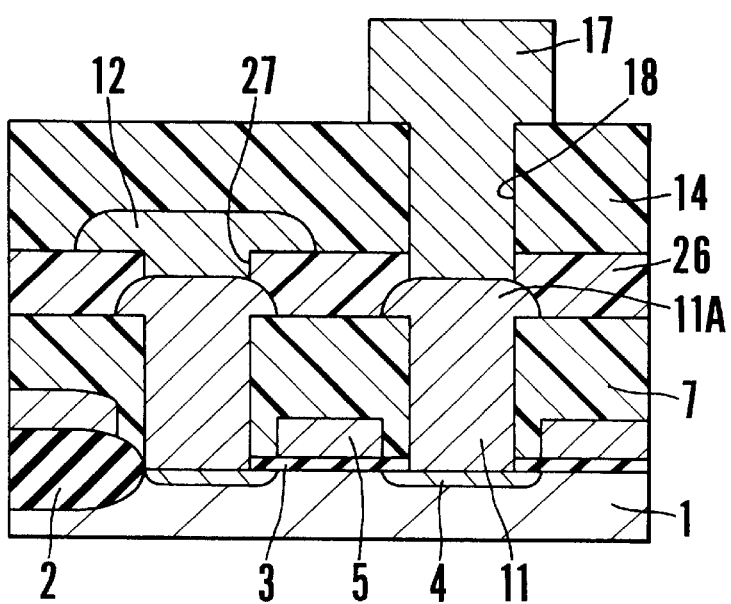
FIG. 4 is a sectional view showing a modification of the second prior art shown in FIG. 2.

In the structure of the semiconductor device formed by this manufacturing method, therefore, the upper diameters, for the pads, of the contact holes $9a$ and $9b$ on the first stage are made larger so as not to cause misalignment of the contact hole 18 on the second stage which is formed above at least one of the contact holes $9a$ and $9b$, whereas the diameters of respective lower portions are made relatively smaller. A larger margin for the bit line 12 and a larger margin for the word line 5 can be assured. Unlike in the prior art shown in FIG. 4, this manufacturing method does not require the process of forming an insulating interlayer after forming a pad at a contact hole, and the process of forming a contact hole therein and forming a bit line 12. Accordingly, the number of steps can be decreased.

Figure 7A:
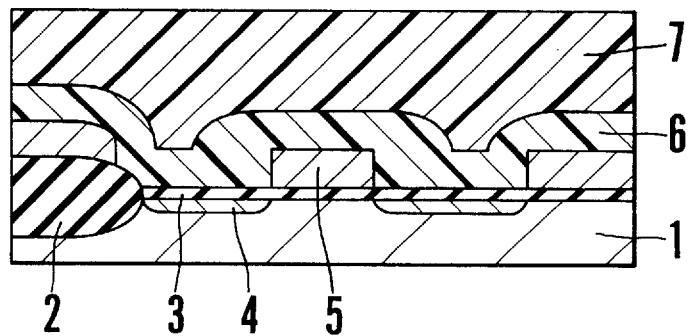
FIGS. 7A to 7H are sectional views respectively showing the steps in the second manufacturing method of the semiconductor device shown in FIG. 5.

FIGS. 7A to 7H are sectional views respectively showing the steps in a method of manufacturing a semiconductor device according to the second embodiment. First, as shown in FIG. 7A, similar to the first embodiment, a field oxide film 2, a gate oxide film 3, element active regions 4, and word lines 5 are formed on a semiconductor substrate 1. A first etching stopper insulating film 6 such as a silicon nitride film or an undoped silicon oxide film, and a first insulating interlayer 7 such as a silicon oxide film doped with an impurity, e.g., phosphorus or boron are grown on the entire surface to have film thicknesses of about 100 nm and about 400 nm, respectively. The film thickness of the first insulating interlayer 7 assumes a film thickness reduction of about 100 nm upon subsequent etching for forming a contact hole.

Figure 7B:
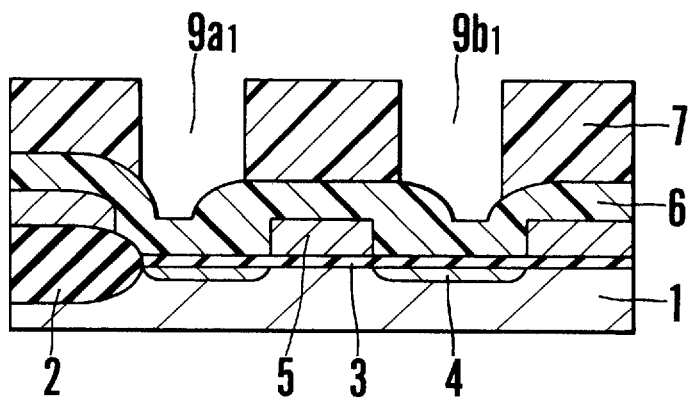
Figure 7C:
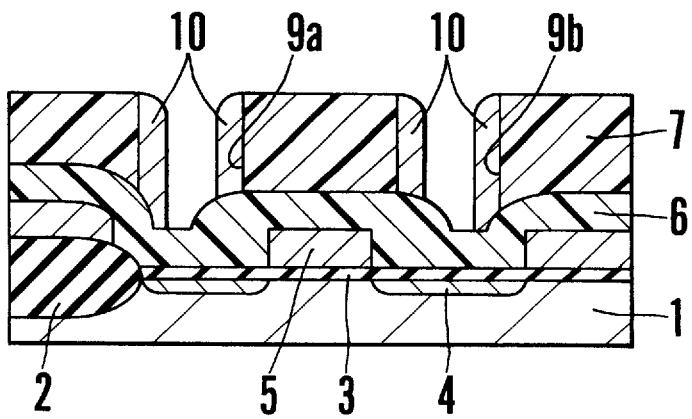
Figure 7D:
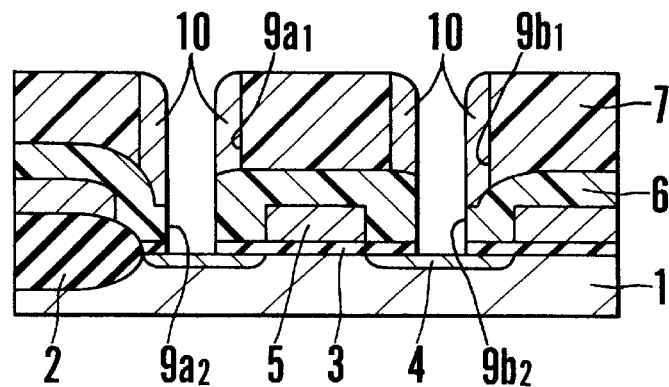

As shown in FIG. 7B, normal lithography and etching are performed to partially etch the first insulating interlayer 7 up to the first etching stopper insulating film 6, thereby forming first upper contact holes $9a_1$ and $9b_1$ respectively at portions where a contact hole 9a for connecting a bit line (not shown) and the element active region 4 and a contact hole 9b for connecting a node electrode (not shown) and the element active region 4 are to be formed. As shown in FIG. 7C, a conductive film such as a polysilicon film or a tungsten film are formed on the entire surface including the first upper contact holes $9a_1$ and $9b_1$ and anisotropically etched to form first side wall conductive layers 10 inside the first upper contact holes $9a_1$ and $9b_1$. As shown in FIG. 7D, the first etching stopper insulating film 6 and the gate oxide film 3 are etched to form first lower contact holes $9a_2$ and $9b_2$ for connecting the bit line and the node electrode to the element active region 4. In this manner, the contact holes $9a$ and $9b$ on the first stage are completely formed. In this process, the film thickness of the first insulating interlayer 7 decreases by about 100 nm to about 300 nm.

Figure 7E:
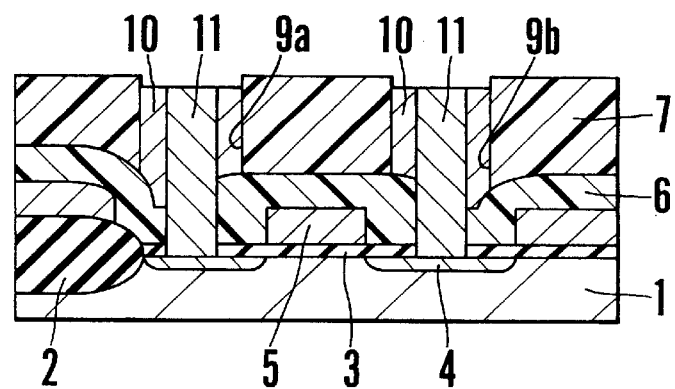
Figure 7F:
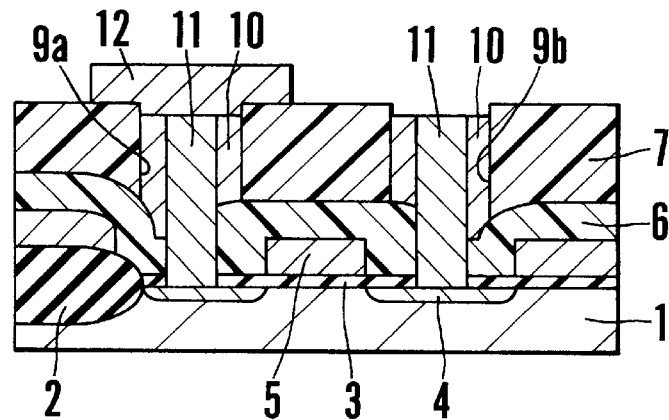
Figure 7G:
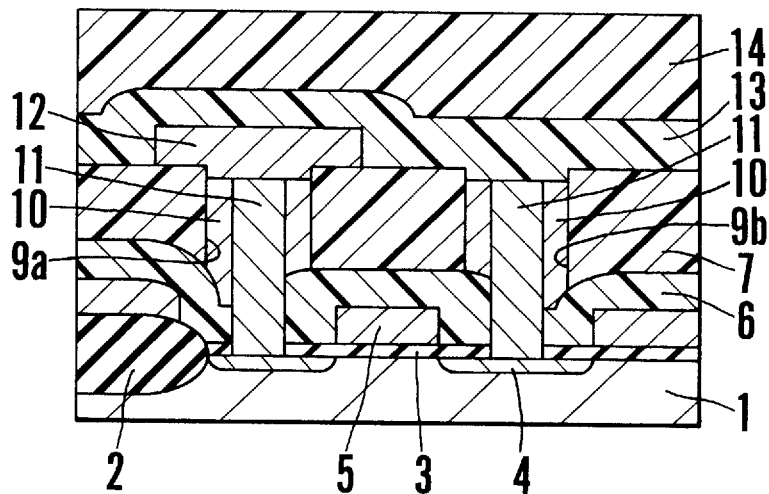

As shown in FIG. 7E, first buried conductive layers 11 are formed inside the contact holes so as to be connected to the element active regions 4. At this time, the surfaces of each first buried conductive layer 11 and each first side wall conductive layer 10 are formed to be recessed from the level of the surface of the first insulating interlayer 7, as in the first embodiment. Further, as shown in FIG. 7F, a bit line 12 is formed. As shown in FIG. 7G, a second etching stopper insulating film 13 such as a silicon nitride film or an undoped silicon oxide film, and a second insulating interlayer 14 such as a silicon oxide film containing phosphorus or boron are grown on the entire surface to have film thicknesses of about 100 nm and about 400 nm, respectively.

Figure 7H:
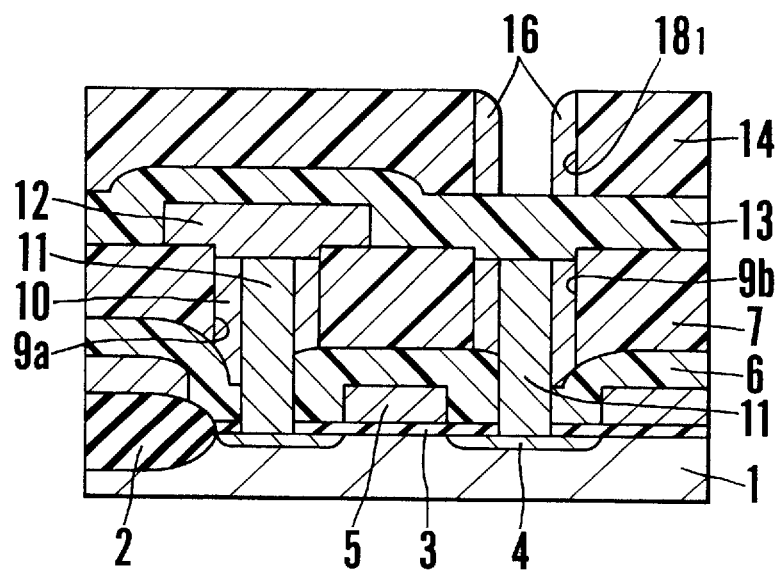

Subsequently, as shown in FIG. 7H, normal lithography and etching are performed to partially etch the second insulating interlayer 14 up to the second etching stopper insulating film 13, thereby forming a second upper contact hole $18_1$ at only a portion where the contact hole 9b for connecting the node electrode (not shown) and the element active region 4 is to be formed. Similar to the first embodiment, a second side wall conductive layer 16 is formed inside the second upper contact hole $18_1$. Thereafter, as in the first embodiment shown in FIG. 5, a second lower contact hole $18_2$ is formed in the second etching stopper insulating film 13 to completely form a contact hole 18. Thereafter, a storage node electrode 17 is formed.

Also in the second embodiment, similar to the first embodiment, a large margin for the word line 5 can be assured. In addition, a margin can be obtained between the bit line 12 and the pad consisting of the first buried conductive layer 11 in the contact hole on the first stage. On the other hand, since no first and second etching stopper buffer films are respectively formed on the first and second insulating interlayers 7 and 14, the number of steps in the second embodiment is smaller than that in the first embodiment, and the manufacture is facilitated. Note that to prevent the film thickness of the insulating interlayer from greatly decreasing in etching the etching stopper insulating film, it is preferable to use an insulating film, such as a silicon nitride film, as an etching stopper insulating film.

In the first and second embodiments, the conductive layer buried in the contact hole 18 on the second stage is directly used as a storage node electrode. However, it is also possible to form a conductive layer only in the contact hole 18 and to form another conductive layer again thereabove. In this case, the shape of the storage node electrode may be a specific three-dimensional structure such as a fin shape or a cylinder shape. Moreover, the electrode may consist of any other film in addition to a polysilicon film.

Each embodiment exemplifies the COB structure in which the storage electrode is formed on a layer above the bit line. However, the present invention can be similarly applied to a case wherein the bit line is formed on a layer above the storage node electrode. Further, in the above embodiments, the present invention is applied to a DRAM memory cell, but is also effective for another semiconductor device which requires the step of forming a contact hole having a high aspect ratio. Still further, although the contact holes on the first and second stages are formed in the same step in the above embodiments, they can be formed by any method as far as the diameter of the bottom portion of the contact hole on the second stage is as small as that of the contact hole on the first stage.

What we claimed is:

1. A semiconductor device comprising:
   (a) a semiconductor substrate having a semiconductor element formed thereon;
   (b) a first etching stopper insulating film formed on said semiconductor substrate;
   (c) a first insulating interlayer formed on said first etching stopper insulating film and having etching selectivity with respect to said first etching stopper insulating film;
   (d) at least a pair of first contact holes formed at a predetermined interval in a direction parallel to a surface of said semiconductor substrate so as to reach said semiconductor element through said first insulating interlayer and said first etching stopper insulating film;
   (e) first buried conductive layers formed in the first contact holes, respectively;
   (f) a first interconnection connected to one of said first buried conductive layers;
   (g) a second insulating interlayer formed on said first interconnection and said first insulating interlayer;
   (h) a second contact hole formed to reach the other one of said first buried conductive layers through said second insulating interlayer;
   (i) a second buried conductive layer formed in the second contact hole; and
   (j) a second interconnection connected to said second buried conductive layer,
   wherein each of the first contact holes includes upper and lower cylindrical portions, the upper cylindrical portion having a larger diameter than the lower cylindrical portion.

2. A device according to claim 1, further comprising a second etching stopper insulating film formed between said first insulating interlayer and said second insulating interlayer, wherein the second contact hole is constituted by a large-diameter upper contact hole formed in said second insulating interlayer and a small-diameter lower contact hole formed in said second etching stopper insulating film.

3. A device according to claim 1, wherein the upper contact hole has a side wall conductive layer formed on an inner surface thereof and wherein an inner diameter of the upper contact hole is equal to an inner diameter of the lower contact hole.

4. A device according to claim 2, wherein the upper contact hole has a side wall conductive layer formed on an inner surface thereof and wherein an inner diameter of the upper contact hole is equal to an inner diameter of the lower contact hole.

5. A device according to claim 1, wherein said semiconductor element is a DRAM memory cell, said first interconnection is a bit line, and said second interconnection is a storage node electrode.

6. A device according to claim 1, wherein the upper cylindrical portions of the first contact holes are formed substantially within the first insulating interlayer and the lower cylindrical portions of the first contact holes are formed substantially within the first etching stopper insulating film.

7. A semiconductor device comprising:
   (a) a semiconductor substrate having a semiconductor element formed thereon;
   (b) a first etching stopper insulating film formed on said semiconductor substrate;
   (c) a first insulating interlayer formed on said first etching stopper insulating film and having etching selectivity with respect to said first etching stopper insulating film;
   (d) at least a pair of first contact holes formed at a predetermined interval in a direction parallel to a surface of said semiconductor substrate so as to reach said semiconductor element through said first insulating interlayer and said first etching stopper insulating film;
   (e) first buried conductive layers formed inside the first contact holes, respectively;
   (f) a first interconnection integrally formed on one of said first buried conductive layers;
   (g) a second etching stopper insulating film formed on said first insulating interlayer;
   (h) a second insulating interlayer formed on said second etching stopper insulating film;
   (i) a second contact hole formed to reach the other one of said first buried conductive layers through said second insulating interlayer and said second etching stopper insulating film;

(j) a second buried conductive layer formed in the second contact hole; and (k) a second interconnection integrally connected to said second buried conductive layer, wherein each of the first contact holes is constituted by a small-diameter lower contact hole formed in said first etching stopper insulating film and a large-diameter upper contact hole formed in said first insulating interlayer, and said first buried conductive, layers do not project from a surface of said first insulating interlayer, and wherein the second contact hole is constituted by a large-diameter upper contact hole formed in said second insulating interlayer and a small-diameter lower contact hole formed in said second etching stopper insulating film.

8. A device according to claim 7, wherein the upper contact hole has a side wall conductive layer formed on an inner surface thereof and an inner diameter of the upper contact hole is equal to an inner diameter of the lower contact hole.

9. A device according to claim 7, wherein said semiconductor element is a DRAM memory cell, said first interconnection is a bit line, and said second interconnection is a storage node electrode.

10. A device according to claim 7, wherein the second insulating interlayer has etching selectivity with respect to the second etching stopper insulating film.

11. A semiconductor device comprising:

(a) a semiconductor substrate having a semiconductor element formed thereon;

(b) a first etching stopper insulating film formed on the semiconductor substrate;

(c) a first insulating interlayer formed on the first etching stopper insulating film;

(d) at least a pair of first buried contacts formed through the first insulating interlayer and the first etching stopper insulating film for electrical connection with the semiconductor element;

(e) a first interconnection connected to one of the first buried contacts;

(f) a second etching stopper insulating film formed on the first insulating interlayer;

(g) a second insulating interlayer formed on the second etching stopper insulating film;

(h) a second buried contact formed through the second insulating interlayer and the second etching stopper insulating film for electrical connection with the other one of the first buried contacts; and (i) a second interconnection connected to the second buried contact, wherein each of the buried contacts includes upper and lower cylindrical portions, the upper cylindrical portion having a larger diameter than the lower cylindrical portion.

12. A device according to claim 11, wherein an upper surface of the first insulating interlayer is positioned above upper surfaces of the first buried contacts.

13. A device according to claim 12, wherein the first insulating interlayer has a pair of substantially cylindrical openings formed near the upper surface thereof and the upper cylindrical portions of the first buried contacts are disposed within the pair of substantially cylindrical openings.

14. A device according to claim 11, wherein the first insulating interlayer has etching selectivity with respect to the first etching stopper insulating film.

15. A device according to claim 14, wherein the second insulating interlayer has etching selectivity with respect to the second etching stopper insulating film.

16. A device according to claim 11, wherein the upper cylindrical portions of the first buried contacts are disposed substantially within the first insulating interlayer and the lower cylindrical portions of the first buried contacts are disposed substantially within the first etching stopper insulating film.

* * * * *